United States Patent
Lu et al.

(10) Patent No.: US 6,210,754 B1
(45) Date of Patent: Apr. 3, 2001

(54) METHOD OF ADJUSTING FOR PARALLEL ALIGNMENT BETWEEN A SHOWER HEAD AND A HEATER PLATFORM IN A CHAMBER USED IN INTEGRATED CIRCUIT FABRICATION

(75) Inventors: Tsung-Lin Lu, Tainan Hsien; Ping-Chung Chung, Hsinchu Hsien; Tso-Lung Lai, Taoyuan Hsien, all of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/246,754

(22) Filed: Feb. 8, 1999

(30) Foreign Application Priority Data

Dec. 31, 1998 (TW) ................................. 87121968

(51) Int. Cl.$^7$ ..................................................... C23C 16/00
(52) U.S. Cl. ........................ 427/248.1; 427/99; 438/679; 438/680; 438/758
(58) Field of Search .................................. 427/99, 248.1; 438/679, 670, 758

(56) References Cited

U.S. PATENT DOCUMENTS 3,632,213 * 1/1972 Trice .
4,728,799 * 3/1988 Gordon et al. .
4,987,856 * 1/1991 Hey et al. .

\* cited by examiner

Primary Examiner—Timothy Meeks
(74) Attorney, Agent, or Firm—Jiawei Huang; J. C. Patents

(57) ABSTRACT

A method is proposed for use in a chamber used in IC fabrication to adjust for parallel alignment between a shower head and a heater platform in the chamber, so that later the deposition process performed in the chamber can result in an evenly deposited layer on the wafer. This method is characterized by the provision of a plurality of displacement gauges between the shower head and the heater platform, with the heater platform being adjusted in such a manner as to allow all the distance readings from the displacement gauges to be substantially equal to a predetermined fixed value. This not only allows the shower head and the heater platform to be aligned and parallel to each other, but also allows them to be separated by a predetermined, fixed distance. The parallel alignment allows all deposition processes subsequently performed in the chamber to provide an evenly deposited layer on the wafer, and the fixed distance between the shower head and the heater platform allows the wafers fabricated from different chambers to be consistent in quality.

5 Claims, 1 Drawing Sheet

METHOD OF ADJUSTING FOR PARALLEL ALIGNMENT BETWEEN A SHOWER HEAD AND A HEATER PLATFORM IN A CHAMBER USED IN INTEGRATED CIRCUIT FABRICATION

CROSS-REFERENCE TO RELATED APPLICATION

This application claims the priority benefit of Taiwan application serial no. 87121968, filed Dec. 31, 1998, the full disclosure of which is incorporated herein by reference.

BACKGROUND OF THE INVENTION

1. Field of the Invention

This invention relates to integrated circuit (IC) fabrication technology, and more particularly, to a method for use in a chamber used in IC fabrication to adjust for parallel alignment between a shower head and a heater platform in the chamber, so that later the deposition process performed in the chamber can result in an evenly deposited layer on the wafer.

2. Description of Related Art

As IC fabrication technology advances to the submicron level of integration, the fabrication processes become more critical. Any minute errors in the fabrication can lead to a complete failure to the fabricated IC product. Should this be the case, the fabricated IC product may have to be discarded. This makes the IC fabrication quite wasteful and costly to carry out.

Deposition is a highly critical process in IC fabrication. There are two major deposition techniques in IC fabrication: physical-vapor deposition (PVD) and chemical-vapor deposition (CVD).

A deposition process, whether PVD or CVD, is customarily performed in a sealed vacuum chamber. The chamber includes a shower head and a heater platform therein. During the deposition process, the wafer is placed on the heater platform while vapor or gases is applied to the wafer from the shower head. To allow precise fabrication, the shower head and the heater platform should be precisely horizontally-oriented; otherwise, the deposited layer is unevenly dimensioned in thickness.

FIG. 1 is a schematic diagram used to depict a conventional method to achieve the foregoing purpose. As shown, the method of the invention is applied to a chamber 10 having a top cover 12 and a bottom cover 14 (in FIG. 1, the top cover 12 is open). A shower head 18 is mounted in the recessed portion 16 on the under side of the top cover 12, while a heater platform 22 is mounted in the recessed portion 20 of the bottom cover 14. A pair of level-adjusting devices 24, 26, each being composed of a threaded bar and a nut screwed onto the threaded bar, are provided beneath the heater platform 22, preferably on opposite sides of the heater platform 22. The technician can manually turn the threaded bars to level the heater platform 22.

By the conventional method, the top cover 12 is flipped open from the bottom cover 14, and then several displacement gauges 28, 30 are placed on the heater platform 22 above the level-adjusting devices 24, 26. The technician then manually turns the threaded bars in the level-adjusting devices 24, 26 while visually checking the level indications from the displacement gauges 28, 30 until all of them are level. After this, the displacement gauges 28, 30 are removed, and then the top cover 12 is closed again. At this stage, however, although the heater platform 52 is level, the gap between the shower head 18 and the heater platform 52 may not be even, i.e., the space at one point may be wider than at another point. A solution to this problem is to actually perform a deposition process on a wafer (not shown) placed on the heater platform 52, and then measure the thickness of the material distributed over the wafer by the deposition process for use as a reference for further adjustment. The deposition and adjustment typically need to be performed several times until the deposited layer is evenly thick over the wafer.

It is apparent that the above-mentioned conventional method is quite laborious to carry out and is also wasteful of wafers. Moreover, since the gap between the shower head 18 and the heater platform 22 is inconsistently fixed in dimension, the fabricated wafers from different chambers are inconsistent in quality.

SUMMARY OF THE INVENTION

It is therefore an objective of the present invention to provide a new adjustment method for the shower head and the heater platform in a chamber, which requires no repetitions in deposition and adjustment, so that the IC fabrication can be more cost-effective than the prior art without having to waste wafers.

It is another objective of the present invention to provide a new adjustment method for the shower head and the heater platform in a chamber, which allows the gap between the shower head and the heater platform to be consistently fixed in dimension, so that the fabricated wafers from different chambers are consistent in quality In accordance with the foregoing and other objectives of the present invention, a new adjustment method is proposed for use in IC fabrication to adjust for parallel alignment between the shower head and the heater platform in a chamber.

Broadly speaking, the method of the invention includes the following steps: (1) providing a plurality oi level-adjusting devices on the heater platform; (2) providing a plurality of displacement gauges between the heater platform and the shower head, each being located substantially aligned to one of the level-adjusting devices; and (3) adjusting the level-adjusting devices to adjust the leveling of the heater platform until the distance readings from the two displacement gauges substantially reach a predetermined fixed value.

The foregoing method is characterized by the provision of a plurality of displacement gauges between the shower head and the heater platform, with the heater platform being adjusted in such a manner as to allow all the readings from the displacement gauges to be all the same. This not only allows the shower head and the heater platform to be aligned and parallel, but also allows them to be separated by a predetermined, fixed distance. The parallel alignment allows all deposition process subsequently performed in the chamber to provide an evenly deposited layer on the wafer, and the fixed distance between the shower head and the heater platform allows the wafers fabricated from different chambers to be consistent in quality.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

A preferred embodiment of the adjustment method according to the invention for parallel alignment between a shower head and a heater platform in a chamber used in IC fabrication is disclosed in the following in full details with reference to FIG. 2.

Figure 1:
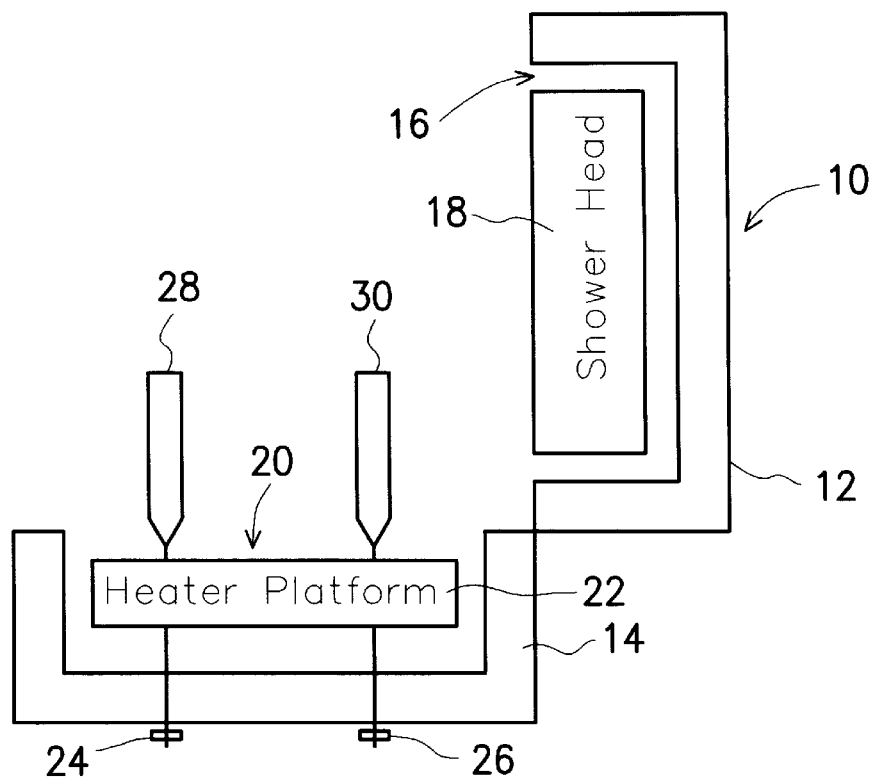
FIG. 1 is a schematic diagram used to depict a conventional method for adjusting for parallel alignment between a shower head and a heater platform in a chamber used in IC fabrication.
Figure 2:
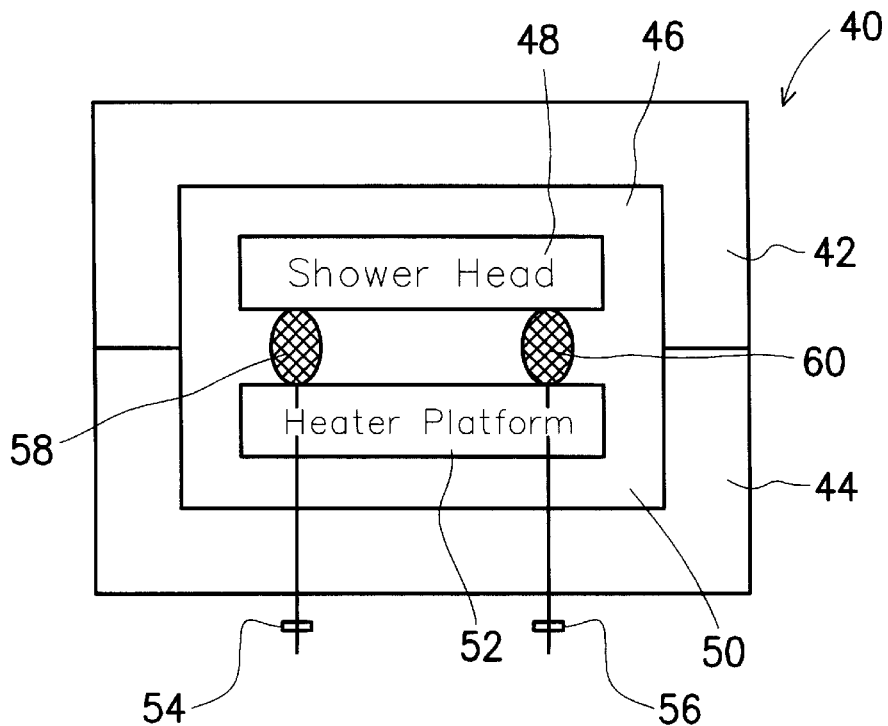
FIG. 2 is a schematic diagram used to depict the method according to the invention for adjusting for parallel alignment between a shower head and a heater platform in a chamber used in IC fabrication.

As shown, the method of the invention is applied to a chamber 40 having a top cover 42 and a bottom cover 44 (in FIG. 2 the top cover 42 is closed). Inside the chamber 40, a shower head 48 is mounted in the recessed portion 46 on the under side of the top cover 42, while a heater platform 52 is mounted in the recessed portion 50 of the bottom cover 44. A plurality of, for example two, level-adjusting devices 54, 56 are mounted on the bottom of the heater platform 52, each being composed of a threaded bar and a nut screwed onto the threaded bar. The technician can manually turn the threaded bars to adjust the leveling of the heater platform 52.

It is a characteristic feature of the invention that a plurality of, for example four, displacement gauges 58, 60, such as resistance gauges, strain gauges, or capacitor gauges, are mounted on the heater platform 52 above the level-adjusting devices 54, 56. The displacement gauges 58, 60 are each capable of providing a distance reading indicative of the distance between the topmost end and the bottommost end thereof. In the case of FIG. 2, the distance reading indicates the distance separating the shower head 48 and the heater platform 52 at the point where each of the displacement gauges 58, 60 is mounted.

By the method of the invention, the technician can manually turn the threaded bars in the level-adjusting devices 54, 56 while visually checking the distance readings from the two displacement gauges 58, 60 until the two distance readings are substantially the same, and more preferably until the two distance readings all reach a predetermined fixed value. This allows the shower head 48 and the heater platform 52 to be substantially parallel and aligned to each other, and separated by a predetermined, fixed distance. After this, the displacement gauges 58, 60 are removed so that the chamber 40 can be used to perform a deposition process.

It can be learned from the foregoing description that the method of the invention is characterized by the use of the displacement gauges 58, 60 to allow the gap between the shower head 48 and the heater platform 52 to be evenly wide, thus allowing parallel alignment and fixed distance between the shower head 48 and the heater platform 52.

Compared to the prior art, the method of the invention requires no repetitions in deposition and adjustment, so that the IC fabrication can be more cost-effective than the prior art without having to waste wafers. Moreover, the method of the invention allows a number of chambers to be such adjusted so that the gap between the shower head and the heater platform in each of these chambers is substantially the same, thus allowing the wafers fabricated from these different chambers to be nevertheless consistent in quality.

In conclusion, the method of the invention is characterized by the provision of a plurality of displacement gauges between the shower head and the heater platform, with the heater platform being adjusted in such a manner as to allow all the distance readings from the displacement gauges to be substantially all the same, thus allowing the shower head and the heater platform to be parallel, aligned and separated by a predetermined, fixed distance.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method for aligning a heater platform parallel to a lower surface of a shower head positioned approximately parallel above it, inside a PVD or CVD deposition chamber, the method comprising:

providing a plurality of level-adjusting devices mounted on the heater platform, wherein the turning of one or more of the level-adjusting devices allows to position the heater platform relative to the lower surface of the shower head, and wherein no level-adjusting device is mounted on the shower head;

providing a plurality of displacement gauges located between the heater platform and the lower surface of the shower head, each being located subtantially aligned to a level-adjusting device and measuring the distance between two opposite points upon the lower surface of the shower head and the heater platform;

operating the level-adjusting devices to adjust the position of the heater platform so that the displacement gauges substantially indicate a same predetermined value.

2. The method as claimed in claim 1, wherein the displacement gauges are resistance gauges.

3. The method as claimed in claim 1, wherein the displacement gauges are strain gauges.

4. The method as claimed in claim 1, wherein the displacement gauges are capacitor gauges.

5. The method as claimed in claim 1, wherein the shower head is positioned directly above the heater platform.

* * * * *